(12) United States Patent
Lee et al.

(10) Patent No.: US 9,850,583 B2
(45) Date of Patent: Dec. 26, 2017

(54) APPARATUS AND METHOD FOR FORMING LUBRICANT RECESS HAVING MINUTE CONFIGURATION IN CURVED INNER SURFACE

(71) Applicant: Hwabaek Engineering Co., LTD., Siheung-si (KR)

(72) Inventors: Kang Lee, Siheung-si (KR); Young Hwan Uhm, Siheung-si (KR); Jung Min Han, Siheung-si (KR)

(73) Assignee: Hwabaek Engineering Co., LTD., Siheung-si (KR)

( * ) Notice: Subject to any disclaimer, the term of this patent is extended or adjusted under 35 U.S.C. 154(b) by 250 days.

(21) Appl. No.: 14/185,084

(22) Filed: Feb. 20, 2014

(65) Prior Publication Data
US 2015/0020966 A1   Jan. 22, 2015

(30) Foreign Application Priority Data

Jul. 16, 2013   (KR) .................. 10-2013-0083554

(51) Int. Cl.
| | |
|---|---|
| C23F 1/08 | (2006.01) |
| B05C 7/08 | (2006.01) |
| B05D 1/28 | (2006.01) |
| B05D 1/40 | (2006.01) |
| C25F 3/14 | (2006.01) |
| C23F 1/02 | (2006.01) |
| C25F 3/06 | (2006.01) |
| C25F 7/00 | (2006.01) |
| G03F 7/16 | (2006.01) |
| G03F 7/20 | (2006.01) |

(Continued)

(52) U.S. Cl.
CPC .................. *C23F 1/08* (2013.01); *B05C 7/08* (2013.01); *B05D 1/28* (2013.01); *B05D 1/40* (2013.01); *C23F 1/02* (2013.01); *C25F 3/06* (2013.01); *C25F 3/14* (2013.01); *C25F 7/00* (2013.01); *G03F 7/16* (2013.01); *G03F 7/2004* (2013.01); *G03F 7/24* (2013.01); *G03F 7/30* (2013.01); *B05D 2254/04* (2013.01); *Y10S 118/10* (2013.01)

(58) Field of Classification Search
CPC .......... G03F 7/24; B05B 3/1064; B05C 7/00; B05C 7/04; B05C 7/06; B05C 7/08; F16L 58/1045; F16L 55/1645; F16L 58/1009; Y10S 118/10; B05D 1/28; B05D 1/40; B05D 2254/04; B05D 7/222
See application file for complete search history.

(56) References Cited

U.S. PATENT DOCUMENTS

| | | | | |
|---|---|---|---|---|
| 3,044,441 | A | * 7/1962 | Blakeslee | ............. B05B 3/1021 |
| | | | | 118/317 |
| 3,645,178 | A | * 2/1972 | Speicher | .................. H02K 3/26 |
| | | | | 355/84 |

(Continued)

*Primary Examiner* — Karla Moore
*Assistant Examiner* — Margaret D Klunk
(74) *Attorney, Agent, or Firm* — Shumaker & Sieffert, P.A.

(57) ABSTRACT

Disclosed is an apparatus and method for forming lubricant recesses having minute configurations by applying a photolithograph method in a curved inner surface, such as a cylinder bore surface of a cylinder block, the inside of a cylinder liner, the inside of a compressor cylinder, a big end of a connecting rod, a big end bearing, a shaft insertion hole of a rocker arm, or the like in an internal combustion engine.

15 Claims, 19 Drawing Sheets

(51) Int. Cl.
*G03F 7/24* (2006.01)
*G03F 7/30* (2006.01)

(56) References Cited

U.S. PATENT DOCUMENTS

| | | | | |
|---|---|---|---|---|
| 3,676,193 | A | * | 7/1972 | Cooper et al. ..... B01D 67/0009 118/317 |
| 5,395,718 | A | * | 3/1995 | Jensen ....................... G03F 1/68 343/708 |
| 5,993,564 | A | * | 11/1999 | Witt ........................ B08B 3/022 134/26 |
| 6,309,806 | B1 | * | 10/2001 | Lenthall .................... G03F 7/24 123/668 |
| 2004/0131137 | A1 | * | 7/2004 | Bernard .............. B05B 15/0406 376/310 |
| 2005/0287294 | A1 | * | 12/2005 | Horn ........................ B05C 7/08 427/230 |
| 2011/0076397 | A1 | * | 3/2011 | Rauch ...................... B05C 7/08 427/230 |

* cited by examiner

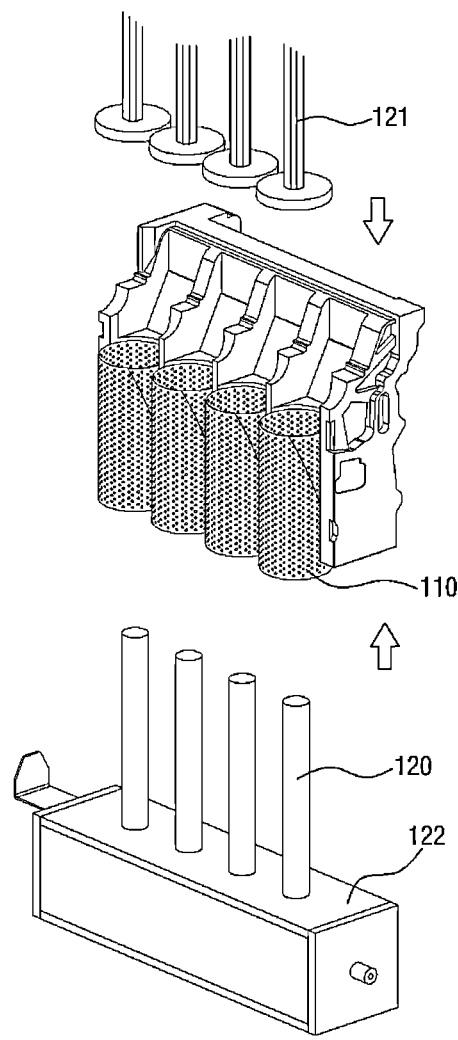

| | Pitch Between Lubricant Recess (μm) | Depth Of Lubricant Recess (μm) | Friction Torque (N · M) | | |
|---|---|---|---|---|---|
| | | | 300 rpm | 600 rpm | 1200 rpm |
| General Cylinder Liner | - | - | 6.87662 | 9.18599 | 12.89648 |
| Cylinder Liner Having Lubricant Recess | 200 | 10 | 6.38334 | 8.14771 | 11.40646 |
| | | 20 | 5.68441 | 7.39778 | 10.63444 |
| | | 30 | 5.32804 | 7.18566 | 10.56980 |
| | 300 | 10 | 6.17611 | 8.16078 | 11.41637 |
| | | 20 | 6.13260 | 7.72062 | 10.82758 |
| | | 30 | 6.17854 | 7.59139 | 10.71751 |
| | 400 | 10 | 6.87610 | 8.96249 | 12.16539 |
| | | 20 | 6.72938 | 8.46398 | 11.56563 |
| | | 30 | 6.21728 | 8.20968 | 11.47912 |

APPARATUS AND METHOD FOR FORMING LUBRICANT RECESS HAVING MINUTE CONFIGURATION IN CURVED INNER SURFACE

CROSS-REFERENCE TO RELATED APPLICATIONS

This U.S. non-provisional patent application claims priority under 35 U.S.C. §119 of Korean Patent Application No. 10-2013-83554, filed on Jul. 16, 2013, the entire contents of which are hereby incorporated by reference.

BACKGROUND OF THE INVENTION

The present invention relates to an apparatus and method for forming lubricant recesses having minute configurations on a curved inner surface, and more particularly, to an apparatus and method for forming lubricant recesses having minute configurations by applying a photolithograph method in a curved inner surface, such as a cylinder bore surface of a cylinder block, the inside of a cylinder liner, the inside of a compressor cylinder, a big end of a connecting rod, a big end bearing, a shaft insertion hole of a rocker arm, or the like in an internal combustion engine.

Various compressors and internal combustion engines may be machines that operate by combining the reciprocating motion of a piston in a cylinder liner or cylinder bore with the rotation motion of a crankshaft through a connecting rod connected to the piston. In such a compressor or internal combustion engine, considerable friction and abrasion may occur between a piston ring and a cylinder bore surface or a cylinder liner, between a connecting rod and a crankshaft, or between a shaft insertion hole of a rocker arm and a rocker arm shaft disposed inside the shaft insertion hole. Thus, various technologies for reducing the friction and abrasion are being developed.

Furthermore, to reduce the friction, various technologies for surface-treating or modifying surfaces of a cylinder bore or cylinder liner, a piston ring, a piston skirt, a big end of a connecting rod, and a big end bearing are being developed. For example, a technology in which lubricant recesses containing a lubricant therein is installed in a frictional surface to form an oil film on the frictional surface, thereby improving lubrication performance and reducing friction and abrasion, and thus improving durability is attempting.

There are various methods for forming lubricant recesses in a frictional surface. For example, a method in which a frictional surface is cut by using a super hard tool or thermally treated processing tool to form lubricant recesses is disclosed in Korean Utility Model Registration No. 20-0409695. Also, a method in which laser is directly irradiated onto a cylinder bore surface to form lubricant recesses is disclosed in Japanese Patent Publication Nos. 2006-255813 or 2008-144937.

Among these methods, the mechanical processing method or the method using the laser may have a limitation in common in that a processing time increases in proportion to the number of lubricant recesses. In an actual application, in case of an engine block, lubricant recesses may be limitedly formed on the vicinity of a top dead point of a piston. In case of a method using a photolithograph process, lubricant recesses to be formed within a cylinder bore may be formed at a time regardless of the number of lubricant recesses or an area of the respective lubricant recesses. However, a technology in which a cylinder block having a plurality of cylinder bores is processed at a time is as yet undeveloped.

SUMMARY OF THE INVENTION

The present invention provides an apparatus and a method for reproducibly forming lubricant recesses having minute configurations on a curved inner surface with configuration as designed by using a photolithograph method.

The present invention also provides an apparatus and a method for forming lubricant recesses having minute configurations on an inner surface having a plurality of curved surfaces such as a cylinder block having a plurality of cylinder bores.

Embodiments of the present invention provide an apparatus for forming lubricant recesses having minute configurations on a curved inner surface, the apparatus comprising: a cleaning unit for cleaning the curved inner surface; a photoresist layer formation unit for applying a photosensitive material on the cleaned curved inner surface to form a photoresist layer; a photomask placing unit for disposing a photomask having a configuration which conforms with the configuration of lubricant recesses proximate to the photoresist layer; an exposure unit for exposing the photoresist layer through the photomask; a developing unit for developing the exposed photoresist layer; an etching unit for selectively etching the curved inner surface exposed by the developing process to form a lubricant recess pattern; and a delaminating unit for separating or removing the photoresist layer remained on the curved inner surface.

In other embodiments of the present invention, a method for forming lubricant recesses having minute configurations on a curved inner surface, the method comprising the steps of: cleaning a curved inner surface; applying a photosensitive material on the curved inner surface to form a photoresist layer; disposing a photomask having a configuration which conforms with a configuration of said lubricant recesses proximate to the photoresist layer; exposing the photoresist layer through the photomask; developing the exposed photoresist layer; selectively etching the curved inner surface exposed by the developing process to form a lubricant recess pattern; and delaminating the photoresist layer remained on the curved inner surface.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 5A to 5E are views for illustrating the exposure unit according to an exemplary embodiment of the present invention.

DETAILED DESCRIPTION OF PREFERRED EMBODIMENTS

Figure 1A:
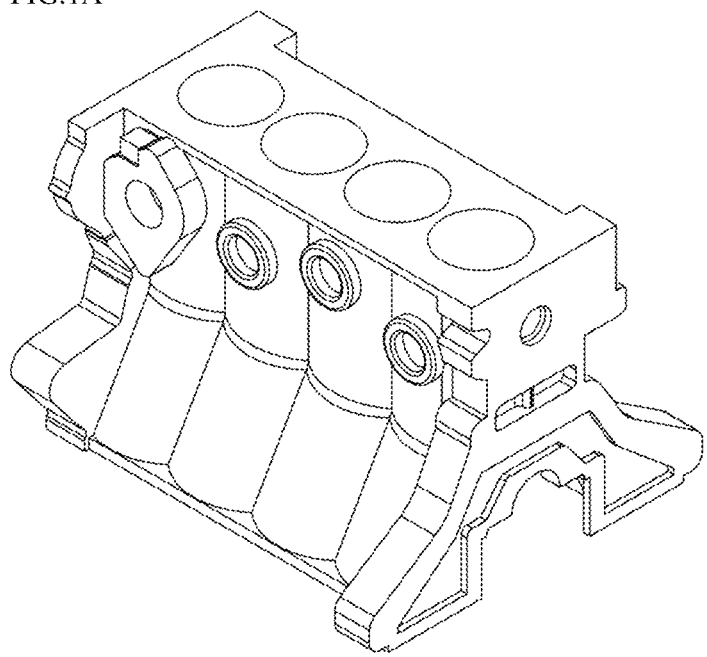
FIG. 1A is a perspective view of a cylinder block.

Hereinafter, preferred embodiments of the present invention will be described in more detail with reference to the accompanying drawings. Also, detailed descriptions related to well-known functions or configurations will be ruled out in order not to unnecessarily obscure subject matters of the present invention.

These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on, the other element or intervening elements may be present. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "lubricant recess" is not construed to be limited to any shape or size. For example, lubricant recesses may range from 10 μm to 10 mm in diameter, preferably 20 μm to 100 μm in diameter, more preferably from 20 μm to 50 μm in diameter.

Figure 1B:
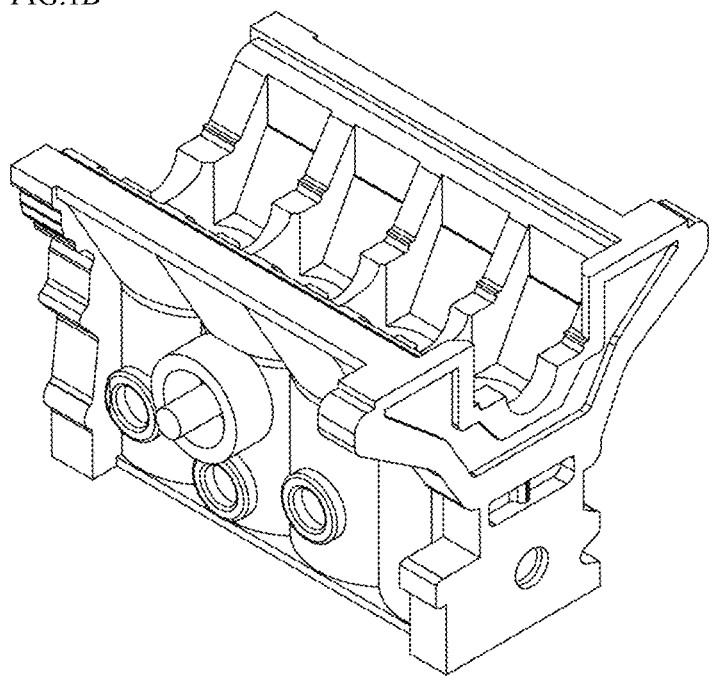
FIG. 1B is an inverted perspective view of the cylinder block of FIG. 1B.
Figure 1C:
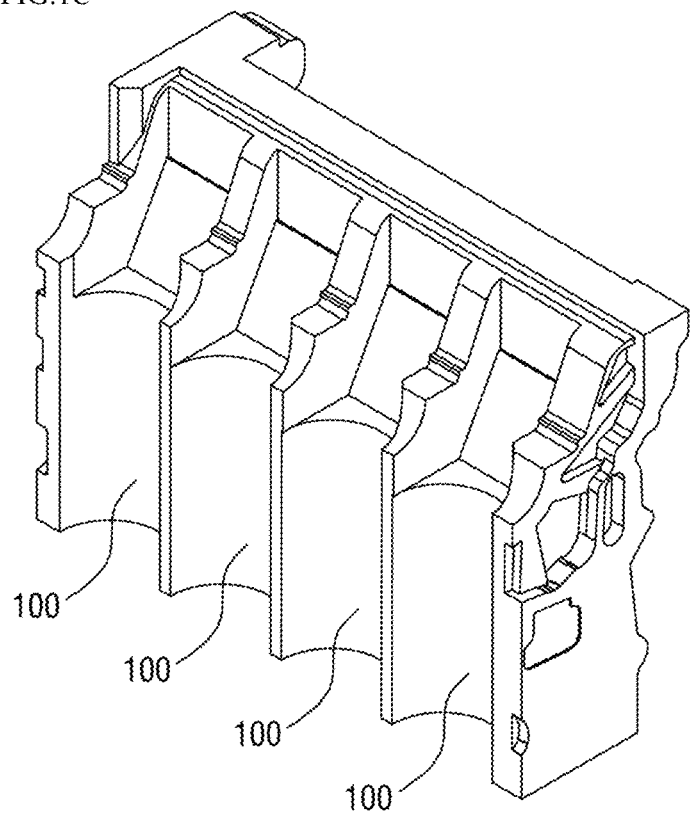
FIG. 1C is a cross-sectional view of the cylinder block of FIG. 1.
Figure 2A:
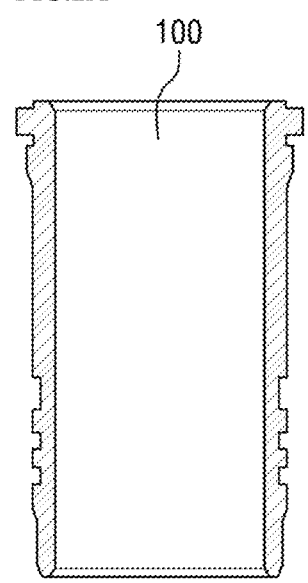
FIG. 2A is a cross-sectional view of a wet cylinder liner.
Figure 2B:
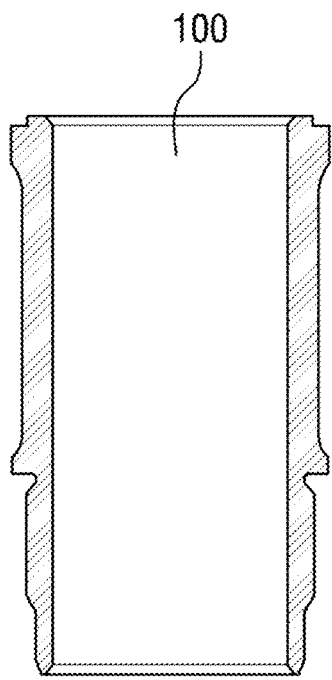
FIG. 2B is a cross-sectional view of a wet cylinder liner (a mini stop)
Figure 2C:
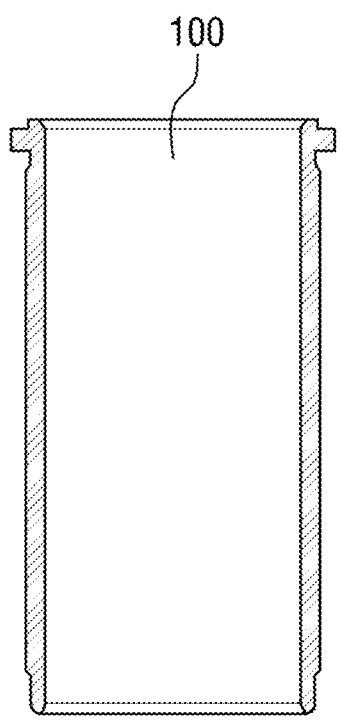
FIG. 2C is a cross-sectional view of a dry cylinder liner.
Figure 2D:
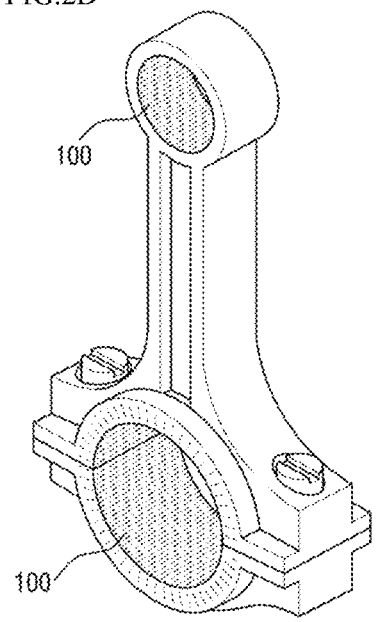
FIG. 2D is a perspective view of a connecting rod.
Figure 2E:
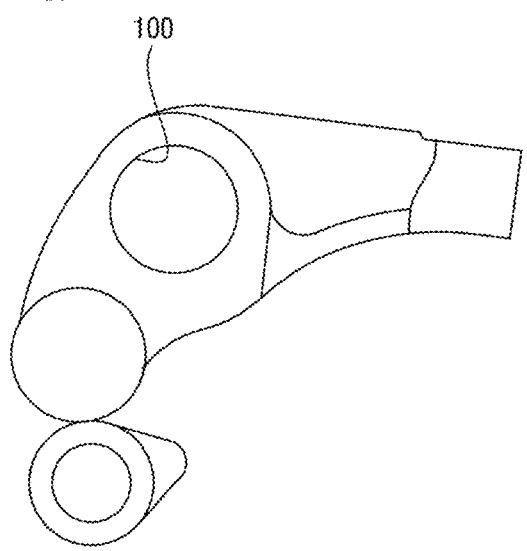
FIG. 2E is a cross-sectional view of a rocker arm.

An lubricant recess formation apparatus according to an exemplary embodiment of the present invention may be an apparatus for reproducibly forming lubricant recesses having minute configurations on an inner surface of a part, which has a curved inner surface similar to a cylindrical shape, such as a cylinder block of FIGS. 1A to 1C, a cylinder liner of FIGS. 2A to 2C, a connecting rod of FIG. 2D, or a shaft insertion hole of a rocker arm of FIG. 2E, with configuration as designed by using a photolithograph method.

The apparatus for forming lubricant recesses having minute configurations on the curved inner surface according to an exemplary embodiment of the present invention may be a system constituted by a cleaning unit for cleaning the curved inner surface, a photoresist layer formation unit for applying a photosensitive material on the cleaned curved inner surface to form a photoresist layer, a photomask placing unit for disposing a photomask having a configuration which conforms with the configuration of lubricant recesses proximate to the photoresist layer, an exposure unit for exposing the photoresist layer through the photomask, a developing unit for developing the exposed photoresist layer, an etching unit for selectively etching the curved inner surface exposed by the developing process to form a lubricant recess pattern, and a delaminating unit for separating or removing the photoresist layer remained on the curved inner surface, which are successively connected each other.

The lubricant recesses having the minute configurations according to an exemplary embodiment of the present invention are installed in a curved inner surface 100 such as a cylinder bore surface of a cylinder block (10), an inner surface of a cylinder liner, a big end of a connecting rod, or a shaft insertion hole of a rocker arm. Here, the curved inner surface 100 may be contaminated by dusts, metal pieces, cutting oil, rust-preventing oil, and the like, which are generated in a pre-processing or transfer process. To uniformly apply a photosensitive material on the curved inner surface, the metal surface has to be cleaned. Thus, the curved inner surface may be cleaned by using a cleaning unit. At least one of well-known degreasing agents of an organic solvent such as acetone, an alkaline degreasing agent, an acidic degreasing agent, and the like may be selected as a chemical solution for cleaning the contaminants according to a kind of metal and a contamination level. Here, the chemical solution may be deposited or sprayed onto the curved inner surface 100 such as a curved surface of the cylinder block, cylinder liner, the connecting rod, the whole rocker arm, or the cylinder bore to clean the curved inner surface 100. In order to make the chemical solution contacts only the curved inner surface 100 of the cylinder bore, etc., a wet spray device or a wet circulation device as shown in FIGS. 6 and 7 may be used. Also, since saponified oil that is one of the contaminants may remain on the curved inner surface 100 when cleaning, the cleaning unit may further include a brush or an auxiliary mechanical unit such as an ultrasonic cleaning unit. After the cleaning process, the cleaned curved inner surface 100 has to be completely dried by using a drying means such as a hot-air dryer before it is moved to a photoresist layer formation unit for applying the photosensitive photoresist.

Figure 3A:
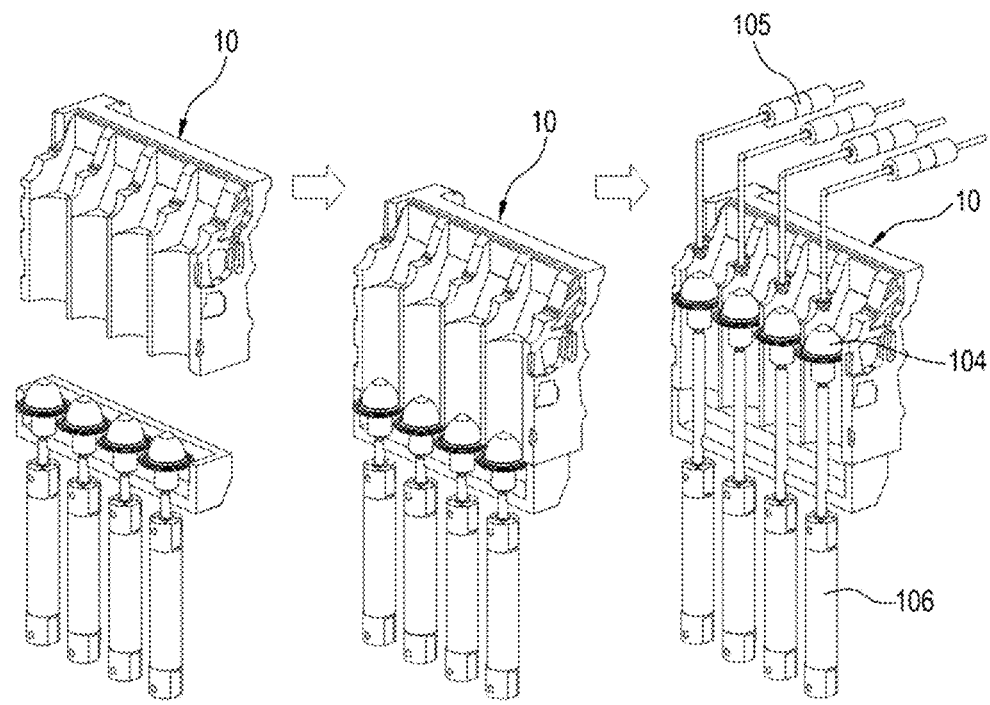
FIG. 3A is a schematic perspective view for illustrating a photoresist layer formation unit of lubricant recesses formation apparatus according to an exemplary embodiment of the present invention.
Figure 3B:
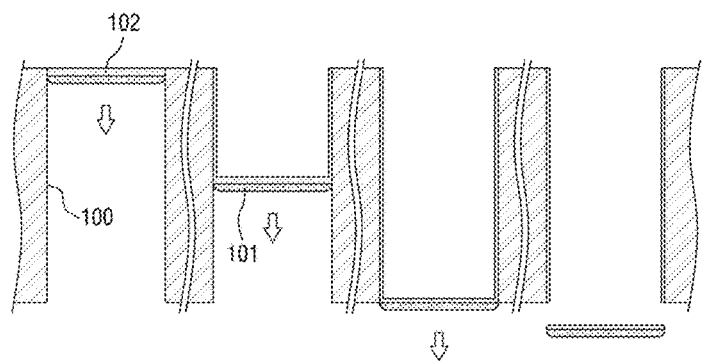
FIG. 3B is a schematic view for explaining a photosensitive material coating process using the photoresist layer formation unit.

FIG. 3A is a schematic perspective view for illustrating the photoresist layer formation unit of the lubricant recess formation apparatus according to an exemplary embodiment of the present invention, and FIG. 3B is a schematic view for explaining a photosensitive material coating process using the photoresist layer formation unit.

The photoresist layer formation unit according to an exemplary embodiment of the present invention includes a coating cup 101 for applying the photosensitive material while being elevated and lowered at a predetermined rate along the curved inner surface 100, a quantitative injection unit 105 for quantitatively supplying the liquid photosensitive elematerial into the coating cup 101, a driving unit 106 for elevating and lowering the coating cup 101, and an extension unit 103 connecting the coating cup 101 to the driving unit 106.

Referring to FIG. 3A, when the photoresist layer is formed, the coating cup 101 may be inserted into the inside of the curved inner surface 100 of the object on which the cleaning and drying processes are performed so that the coating cup 101 is located at an upper end of the curved inner surface 100. For example, the coating cup 101 may have a dish shape and an outer diameter greater by a predetermined distance than an inner diameter of the cylinder bore. The coating cup 101 is formed of a material having flexibility, elasticity, and restoring property. Thus, when the coating cup 101 is inserted into the curved inner surface 100 of the cylinder, the coating cup 101 may be deformed and thus lie in close vicinity to the curved inner surface 100 of the cylinder. Referring to FIG. 3B, the liquid photosensitive material 102 is supplied into the coating cup 101 inserted into the cylinder. When the supplying of the liquid photosensitive material is completed, the coating cup 101 may descend at a preset rate to apply the photosensitive material on the curved inner surface of the cylinder bore.

Since the coating cup 101 contacts the photosensitive photoresist, the coating cup 101 should have solvent resistance which is not dissolved or deformed by alcohol or ketone that is one component of the photoresist. Examples of the material having the above-described material property may include a polyethylene resin, a polypropylene resin, a silicon resin, and a Teflon resin. Although the whole coating cup 101 is formed of the above-described material, only a portion of the coating cup 101 directly contacting the curved inner surface of the cylinder may be formed of the above-described material.

Also, since the coating cup 101 is elevated while passing through the inside of the cylinder bore or a cylindrical object such as the cylinder liner, a mechanical driving unit 106 for elevating and lowering the coating cup 101 such as an air actuator cylinder, an electric actuator cylinder, a servo motor, and the like may be connected to an upper or lower portion of the coating cup 101. The coating cup 101 is connected to the driving unit through the extension unit 103.

Figure 3C:
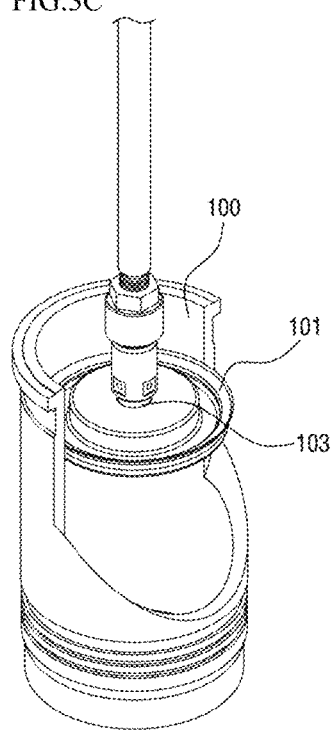
FIGS. 3C and 3D are schematic perspective views illustrating a coating cup of the photoresist layer formation unit of the lubricant recess formation apparatus according to an exemplary embodiment of the present invention.

FIG. 3C is a perspective view illustrating an example of a configuration in which the coating cup 101, to which an extension unit 103 extends to an upper portion thereof, is disposed within the wet cylinder liner according to an exemplary embodiment of the present invention.

Also, if an object to be coated with the photoresist is provided in plurality, for example, in a case of a cylinder block having a plurality of cylinder bores, or in a case where the coating cup 101 applies the photoresist on curved inner surfaces of a plurality of cylinder liners, connecting rods, and rocker arms at the same time or in order of precedence, the coating cup 101 may be provided in plurality. FIG. 3A is a perspective view illustrating an example of a configuration in which the plurality of coating cups 101, to which driving units 106 respectively extend to lower portions thereof, are disposed within a 4-cylinder type cylinder block according to an exemplary embodiment of the present invention.

According to an apparatus for forming lubricant recesses having minute configurations on each of the plurality of curved inner surfaces, the plurality of coating cups, quantitative injection units, driving units, and extension units may be connected in parallel to apply the photosensitive material on the plurality of curved inner surfaces at the same time.

To realize an objection of the present invention that provides the apparatus for reproducibly forming lubricant recesses having the minute configuration on the curved inner surface of the cylinder object with configuration as designed, it is preferable to uniformly apply the photoresist, thereby forming a photoresist layer having a uniform thickness. If the photoresist layer formed on the curved inner surface of the cylinder bore or the cylinder liner is non-uniform in thickness or different in thickness according to objects, lubricant recesses formed on a portion on which the photoresist is thinly applied may increase in size, and lubricant recesses formed on a portion on which the photoresist is thickly applied may decrease in size when compared to that of the designed lubricant recesses. The photosensitive photoresist layer applied on the curved inner surface 100 of the cylindrical object may have a thickness that varies according to the viscosity of the liquid photoresist and the elevating transfer rate of the coating cup in addition to an amount of liquid photoresist contained in the coating cup. That is, the more the liquid photoresist increases in viscosity, the more the applied photoresist layer may increase in thickness. Also, the more the liquid photoresist decreases in transfer rate, the more the photoresist layer may increase in thickness. Also, the more an amount of liquid photoresist contained in the coating cup increases, the more the photoresist layer may decrease in thickness. Thus, it may be necessary to adequately adjust these process variables. The viscosity of the liquid photoresist has to be periodically or successively monitored and adjusted by using a known viscometer. Here, the descending rate of the coating cup may be adjusted by using the air actuator cylinder, the electric actuator cylinder, the servo motor, or the like, and also the transfer rate of the coating cup may be adjusted by using a precision regulator, an RPM gauge, or the like.

Figure 3D:
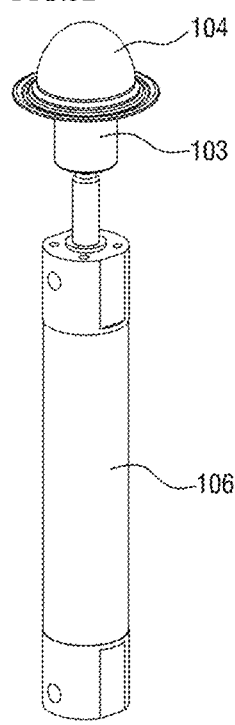

The quantitative injection unit 105 may be a unit for adjusting an amount of liquid photoresist to be supplied into the coating cup. A micro pump or syringe pump may be used as the quantitative injection unit 105. Thus, the liquid photoresist has to be uniformly supplied each time by the quantitative injection unit 105 to uniformly distribute the supplied liquid photoresist into the coating cup. For this, as shown in FIG. 3D, a central portion 104 of the coating cup may protrude upward from an edge thereof contacting the curved inner surface of the cylinder. FIG. 3D is a perspective view illustrating an example of a configuration in which the coating cup having the protruding central portion 104 is disposed within the 4-cylinder type cylinder block of FIG. 3A, and the quantitative injection unit 105 for injecting the liquid photoresist is disposed above the central portion 104.

After the photosensitive photoresist is completely applied, the photoresist layer may be dried or cured by using a hot-air dryer or heater according to a kind of photoresist as necessary.

Figure 4A:
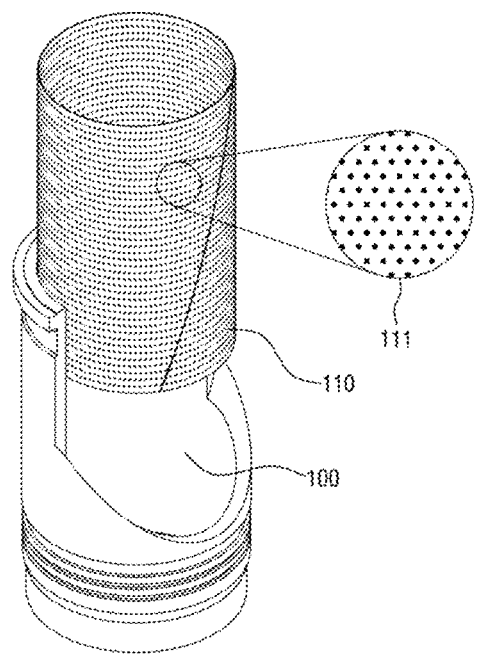
FIGS. 4A to 4D are schematic views for illustrating an exposure process using the exposing unit according to an exemplary embodiment of the present invention.
Figure 4B:
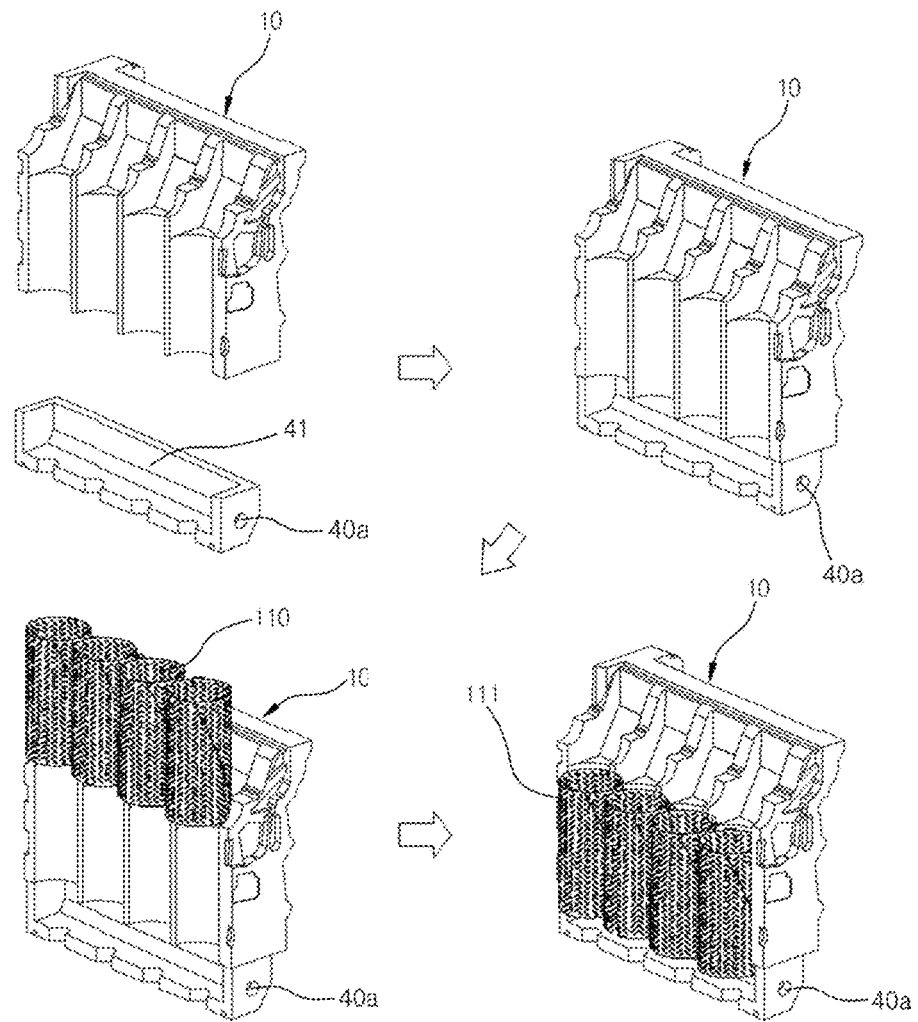
Figure 4C:
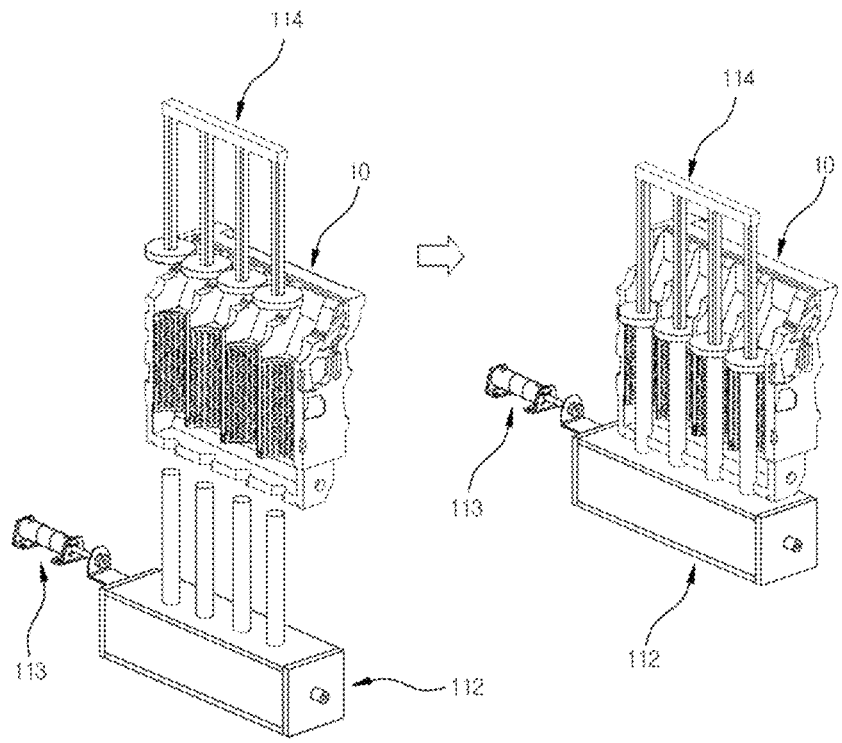
Figure 4D:
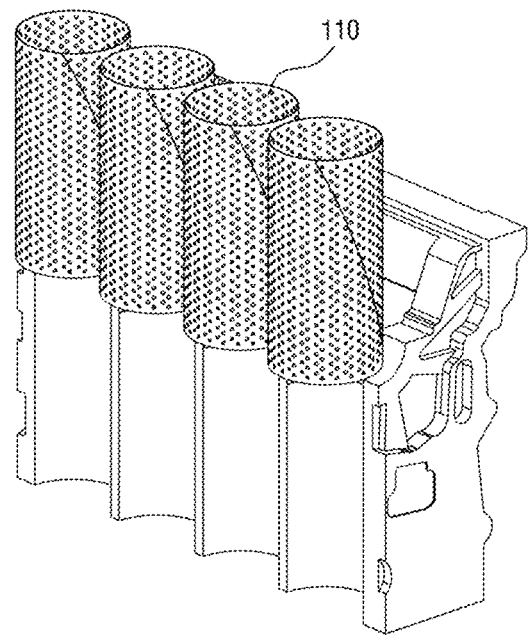

The photomask placing unit disposes a photomask having a configuration which conforms with the configuration of lubricant recesses proximate to the photoresist layer. A photomask 110 on which a configuration 111 of the lubricant recesses to be formed is printed is rolled in a cylindrical shape and then is inserted into the cylinder bore of the cylinder block or the curved inner surface 100 of the cylindrical object such as the cylinder liner. Alternatively, a photomask that is punched in a shape corresponding to those of the lubricant recesses is rolled in a cylindrical shape and then is inserted into the inside of the curved inner surface 100. FIG. 4A is a perspective view illustrating an example of a configuration in which a film-shaped photomask 110 is inserted into the inside of the wet cylinder liner according to an exemplary embodiment of the present invention, and FIGS. 4B to 4D are perspective views illustrating another example of a configuration in which the film-shaped photomask 110 is inserted into the cylinder bore of the 4-cylinder type cylinder block according to an exemplary embodiment of the present invention.

A kind of film-shaped photomask may vary according to a kind of applied photosensitive photoresist. In a case of a negative method in which the photoresist is cured by light, the lubricant recesses to be formed on a transparent film have to be printed with a black color. On the other hand, in a case of a positive method, the lubricant recesses may be transparent, and the remaining portion may be opaque so that light passes through only the transparent portion or passes through only a portion that is punched by applying the photomask punched in a shape corresponding to those of the lubricant recesses.

If the photomask are not in close contact with the curved inner surface because of bubbles between the photomask and the curved inner surface, it may be difficult to form lubricant recesses on the curved inner surface as designed. Thus, the inserted photomask has to be in close contact with the curved inner surface on which the photosensitive photoresist is applied.

The photomask placing unit of the present invention may include a unit for applying at least one solution selected from liquid paraffin and isoparaffin between the photoresist layer and the photomask. The liquid paraffin or isoparaffin may have sufficient viscosity for drawing the photomask into close contact with the photoresist layer. Also, the liquid paraffin or isoparaffin have superior light transmittance without damaging the metal surface, the photoresist layer, and the photomask and thus do not interrupt an exposure process or do not significantly delay an exposing time. In addition, the liquid paraffin or isoparaffin may be easily cleaned for the next process and be a harmless liquid in the post process even if the liquid paraffin or isoparaffin is not cleaned. Thus, the liquid may be applied on the curved inner surface of the cylinder bore or the cylindrical object such as the cylinder liner, and then, the photomask may be inserted into the cylinder bore or the cylindrical object.

The photomask placing unit may further include a vacuum-applying unit for drawing the photomask and the curved inner surface into close contact by applying a vacuum between the photomask and the photoresist layer. After a photomask having a configuration of lubricant recesses is inserted inside of the curved inner surface of the cylindrical object such as the cylinder liner, the vacuum-applying unit seals upper and lower ends of the photomask and exhaust air through a vacuum hole 40a. The sealing mechanism is formed between a top vacuum block 114, and a bottom vacuum block 41. The vacuum-applying unit applies vacuum between the photomask and the photoresist layer of the curved inner surface through the vacuum hole 40a in the bottom vacuum block 41, and disposing the photomask proximate to the curved inner surface. Here, a vacuum pump or vacuum ejector may be used for forming the vacuum. Since it is preferable that the vacuum state within the cylinder object is maintained during the exposure process, the photomask placing unit may be integrated with an exposure unit. This will be described later. In the present invention, either one or both method (viscous solution or vacuum applying means) may be used in order to exhaust the air between the photomask and the curved inner surface to improve the proximity between the photomask and the curved inner surface coated with the photoresist.

Figure 5A:
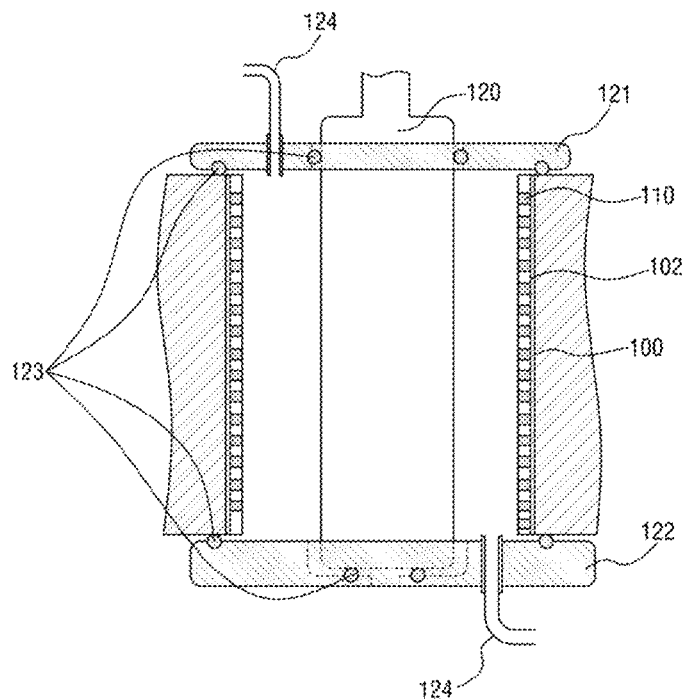

Referring to FIGS. 5A-5E, the exposure unit of the present invention includes a light emitting unit 120 which is inserted into the inside of the curved inner surface and irradiates light toward the curved inner surface, a light source lamp 130 which is disposed inside or outside the light emitting unit 120 and generates light that is emitted onto the curved inner surface via the light emitting unit 120, an extension unit 133 connecting the light source lamp 130 to the elevation unit, and the elevation unit 126 for elevating and lowering the light emitting unit 120 to take the light emitting unit in or out of the curved inner surface 100. To perform the exposure process after the photomask film 110 is closely attached to the curved inner surface 100, the light emitting unit 120 is inserted into the inside of the curved inner surface of the cylinder to expose the photosensitive photoresist as shown in FIG. 5A.

The light emitting unit 120 may be formed of a material selected from quartz, glass, acrylic, polymethacrylate, cyclo-olefin polymer (COP), cyclo-olefin copolymer (COC), and polycarbonate. Also, the light emitting unit 120 may be disposed and have a shape to uniformly irradiate light energy onto the whole surface of the curved inner surface 100. It may be preferable that the light emitting unit 120 is disposed at a center of the curved inner surface 100 of the cylinder and has a cylindrical shape. Also, the light emitting unit 120 may be connected to an adequate elevation unit 126 so that the light emitting unit 120 is taken in or out of the curved inner surface 100 of the cylinder. The elevation unit 126 may include an air actuator cylinder, an electric actuator cylinder, and a servo motor, like the above-described unit for elevating and lowering the coating cup.

Also, the exposure unit of the present invention may be a vacuum exposure unit for performing an exposure process in a state where a predetermined vacuum pressure is applied onto the curved inner surface to release the vacuum state after the exposure process is completed. The vacuum exposure unit may improve the adhesion between the photomask and the curved inner surface by using the vacuum. In this case, as shown in FIG. 5A, sealing mechanisms 121 and 122 may be respectively disposed above and under the vacuum exposure unit so that internal air is suctioned and exhausted through the vacuum hole 124 defined in the upper or lower end of each of the upper and lower supports 121 and 122 to maintain the vacuum state within the vacuum exposure unit. Also, in this case, the vacuum pressure may be applied to the curved inner surface before light is irradiated onto the photosensitive photoresist to closely attach the photomask to the curved inner surface. As described above, the predetermined vacuum state may be maintained during the exposure process. This is done because the photomask may be vibrated or displaced if the inner pressure is changed.

Figure 5B:
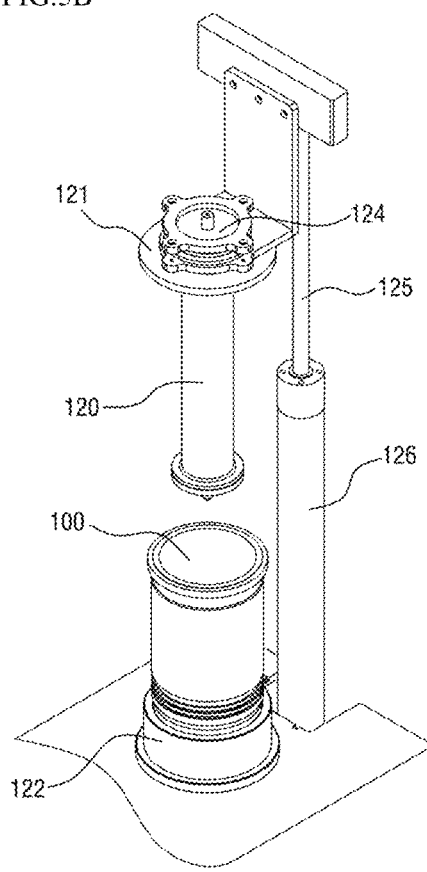

FIG. 5B is a perspective view of a configuration in which the light emitting unit is inserted into a dry cylinder liner according to an exemplary embodiment of the present invention. A sealing 123 for contacting a lower end of the liner that is in contact with the lower support 122 to maintain the sealed state is mounted on the lower support 122. The other sealing 123 may contact a lower end of the light emitting unit 120 to seal the lower portion of the light emitting unit 120. In the current embodiment, the upper cover 121 and the light emitting unit 120 may be integrated with each other. Thus, when the light emitting unit 120 descends by the elevation unit 120 and is inserted into the inside of the cylinder liner, an upper end of the cylinder liner and the sealing 123 within the upper cover 121 may contact each other to seal the inside of the curved inner surface 100 of the cylinder liner from the outside.

According to an exemplary embodiment of the present invention, the vacuum pressure may be applied into the inside of the cylinder liner through the vacuum hole 124 defined in the upper end of each of the upper and lower supports. When light is irradiated by the light emitting unit to pass through the photomask in the state where a predetermined vacuum pressure is maintained so that the light is irradiated onto the photosensitive photoresist applied on the curved inner surface of the cylinder liner through the photomask, the material property of the polymers within the photoresist may be changed, and then, a developing process that is a post process is prepared.

The exposure unit may adequately adjust an amount of light irradiated onto the photosensitive photoresist. For example, in the case of the negative photoresist, if an amount of the light energy exposed to the photoresist is excessive, the photoresist may be overly cured. On the other hand, if an amount of light energy irradiated to the photoresist layer is too small, the photoresist may not be cured accordingly. Here, in the above-described two cases, the developing process may not be well performed. An amount of light energy irradiated to the photosensitive photoresist layer may be expressed by millijoule (mJ) per unit area. Also, an output of the light source may be expressed by watt per unit area. Thus, an amount of work applied to the photoresist per unit area may be obtained by differentiating an output of the light source by an entire area on which the light is irradiated and integrating the differentiated output of the light source over the time interval. That is, if the output of the light source is constant, and the areas on which the light is irradiated are the same, an amount of light irradiated to the photoresist layer may be adjusted by the time control. That is, if the output of the light source is not constant, it may be impossible to adjust an amount of light energy irradiated to the photoresist layer by using only the time control.

The light source lamp 130 may be directly installed within the light emitting unit 120. Alternatively, the light source may be installed outside the light emitting unit 120 to guide light into the light emitting unit 120 by using a mirror, a lens, a prism, an optical fiber, a light guide rod, or the like. The light source lamp 130 may be adequately selected according to a kind of adopted photosensitive photoresist. Here, it may be preferable that an UV lamp is used as the light source lamp. In general, since high-temperature heat is generated from the UV lamp, a cooler for removing the generated heat may be provided. Also, a reflecting plate (the mirror) 131 may be provided to prevent the UV ray from leaking and being lost. A general mirror formed of stainless steel or aluminum may be used as the reflecting plate. Alternatively, a cold mirror through which only the UV ray is reflected, but visible light or infrared light pass may be adopted.

Also, when the light source lamp 130 is disposed within the light emitting unit 120, a shutter 132 may be disposed between the light source lamp and the light emitting unit or outside the light emitting unit. When the light is guided up to the light emitting unit by a light guide unit (not shown) such as a mirror, a shutter 132 for blocking the light may be disposed between the lamp and the light guide unit or inside or outside the light emitting unit 120 to prevent the light from leaking. When the light emitting unit is inserted to turn the light source lamp on and perform the exposure process, and then the light emitting unit is taken out after the lamp is turned off, the shutter may not be needed. However, when the light emitting unit is taken in or out in a state where the light emitting lamp is turned on, the shutter may be provided to prevent the light from leaking.

FIG. 5C is a perspective view illustrating an example of a configuration in which the light emitting unit 120 is inserted into the cylinder bore of the 4-cylinder type cylinder block according to an exemplary embodiment of the present invention. The light emitting unit 120, the extension unit 125, and the elevation unit 126 according to an exemplary embodiment of the present invention may be provided in pluralities which are arranged in parallel. Thus, a plurality of curved inner surfaces may be exposed to light at the same time. In this case, only a single light source lamp may be installed within the exposure unit.

Figure 5D:
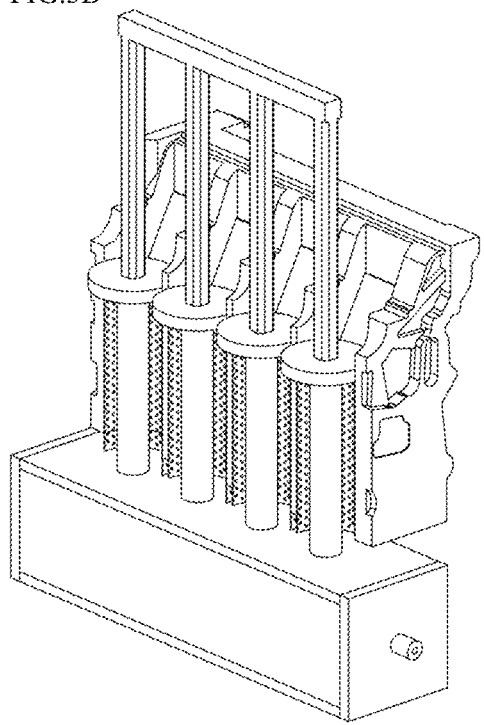

The photosensitive photoresist is applied on each of the curved inner surface of the cylinder bores of the cylinder block. Also, a photomask 110 on which the configuration of lubricant recesses is printed or punched is disposed within each of the cylinder bores of the cylinder block. The sealing mechanism 121 is disposed above the cylinder block, and a light source mechanism including the light emitting unit 120 is disposed under the cylinder block. A portion of the cylinder block contacting the light source mechanism may be formed of an elastic material to serve as the lower support 122. When the cylinder block, the upper cover 121 and the lower support 122 are coupled to each other as shown in FIG. 5D, an curved inner space of each of the cylinder bores may be sealed against the outside to exhaust the air within the cylinder bores through the vacuum hole (not shown) defined in the upper cover 121 or the lower support 122, thereby making the inside of the cylinder bore to a vacuum state. Thereafter, light is irradiated onto the cylinder bore surface by using the light emitting unit 120 to expose the photosensitive photoresist to the light.

Figure 5E:
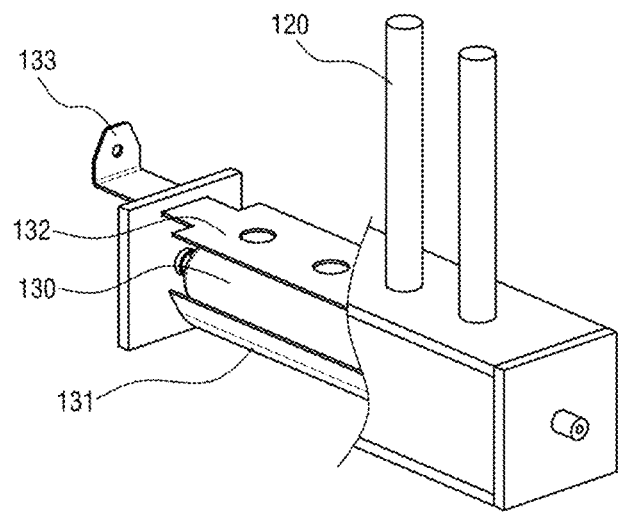

Then, the light source mechanism applied to the above-described example will be described below. As shown in FIG. 5E, the lamp 130 is disposed within the light source mechanism, and a reflecting mirror 131 is disposed on one side surface of the outside of the lamp to guide the light dispersedly emitted from the lamp 30 to one direction, thereby improving optical efficiency. The light emitting unit 120 is disposed outside the light source mechanism, and the light emitting unit 120 is inserted into the cylinder bore of the cylinder block or the inside of the cylinder liner. The shutter 132 is disposed between the light source lamp 130 and the light emitting mechanism within the light source mechanism. The extension unit 133 connected to a driver (not shown) is disposed on a side of the shutter 132 to allow the light to pass through or be blocked. In FIG. 5E, the shutter 132 may be an attaching shutter according to a position and be a guillotine shutter according to a method, but the present invention is not limited thereto. For example, the shutter may be an attaching shutter, a lens shutter, or a focal-plane shutter according to a position and be a guillotine shutter, a roller blind shutter, a sector shutter, or a rotation shutter according to a method.

After an adequate exposing time required for the photosensitive photoresist elapses, the lamp 130 may be turned off, or the shutter 132 may be closed to release the vacuum state within the curved inner surface and then release the coupling between the sealing means and the light emitting unit. The photomask may be removed to the outside of the curved inner surface.

Figure 6A:
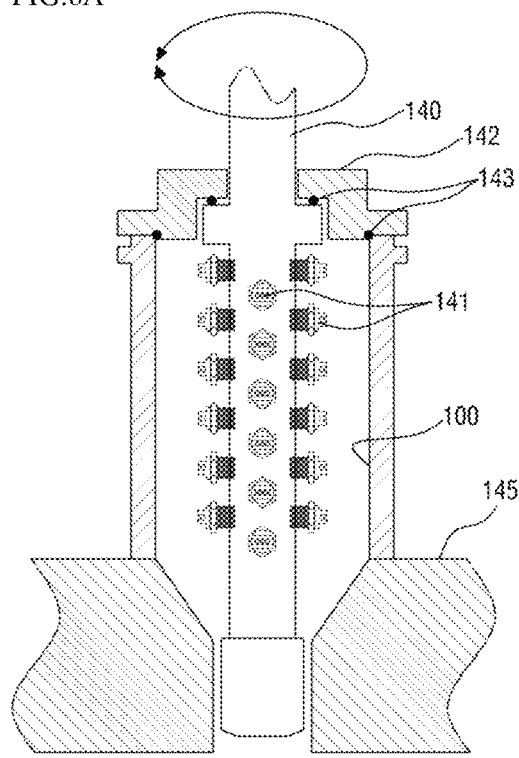
FIGS. 6A to 6C are views for illustrating a wet spray device according to an exemplary embodiment of the present invention.
Figure 6B:
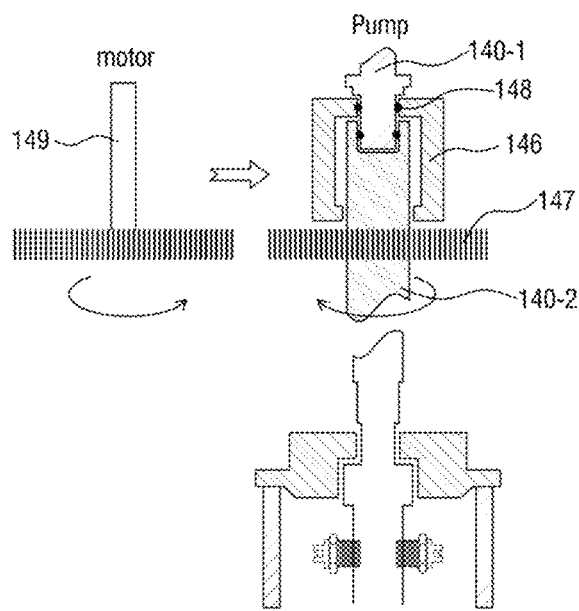
Figure 6C:
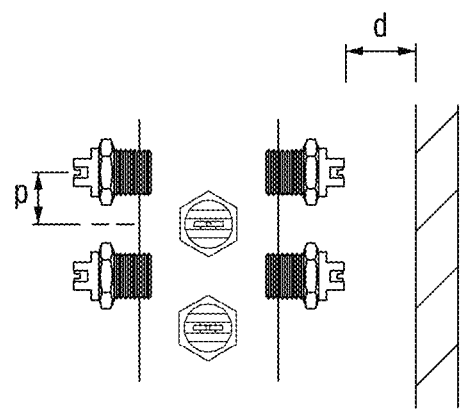

The developing, etching, and delaminating processes after the exposure process may be performed by using aqueous solution of chemical materials for performing a function required for each process. Hereinafter, for convenience of description, these processes may be commonly called a wet process. The etching process may be performed by using an electrolysis etching unit. Each of a developing unit, an etching unit, and a delaminating unit according to an exemplary embodiment of the present invention may be constituted by a wet spray device or wet circulation device for performing a wet process. FIGS. 6A-6C illustrate a wet spray device in which a chemical solution supply tube rotates. As shown in FIG. 6A, the wet spray device includes an upper cover 142 and a lower support 145 for supporting the curved inner surface therebetween; a sealing means 143 to prevent a chemical solution from contacting portions except for the curved inner surface; a fixed chemical solution supply tube 140-1 installed at the upper cover; a rotatable chemical solution supply tube 140-2 to which a plurality of spray nozzles 141 are attached to spray chemical solution to the curved inner surface; a tube connection part 146 for connecting the fixed chemical solution tube to the rotatable chemical solution supply tube 140-2; and a chemical solution discharge port (not shown) for discharging the chemical solution after processing.

The chemical solution supply tube 140 may be inserted into the inside of the curved inner surface 100. Nozzles 141 for spraying the chemical solution are disposed on a side surface of the chemical solution supply tube 140. A lower support 145 and an upper cover 142 may prevent the chemical solution from flowing into other portions except for the curved inner surface 100, i.e., prevent the chemical solution from overflowing to portions except for the curved inner surface 100 when the chemical solution is sprayed. The upper cover 142 prevents the chemical solution from flowing through a gap between the mechanisms by using the sealing 143. Although not shown, a sealing means may be also provided on the portion of the lower support 145.

The chemical solution supply tube 140 of the wet spray device is constituted by the fixed chemical solution supply tube 140-1 connected to a pump, the rotatable chemical solution supply tube 140-2 that rotates within the curved inner surface, and the tube connection part 146 connecting the fixed chemical solution supply tube 140-1 to the rotatable chemical solution supply tube 140-2. To prevent the chemical solution from leaking, at least two sealings 148 may be disposed on an end of the fixed chemical solution supply tube 140-1. A gear 147 is attached to the rotatable chemical solution supply tube 140-2. The gear 147 is engaged with another gear coupled to a rotation shaft 149 that is connected to a motor having an RPM-adjustable function to rotate. Thus, the rotatable chemical solution supply tube 140-2 may rotate. Although not shown, since a plurality of gears are combined with each other by using the above-described method, the plurality of chemical solution supply tubes may rotate simultaneously. When the cylinder block having the plurality of cylinder bores or the plurality of cylinder liners are processed at the same time, the above-described method may be applied.

As shown in FIG. 6C, when a distance between an end of the nozzle 141 and the curved inner surface 100 is d, and a spraying angle of the nozzle at an applied spraying pressure is $\theta$, a distance p between the nozzles may be $d*\tan(\theta/2)$. As necessary, even though it is intended to increase the distance p, the distance p may not exceed $2d*\tan(\theta/2)$.

Figure 7A:
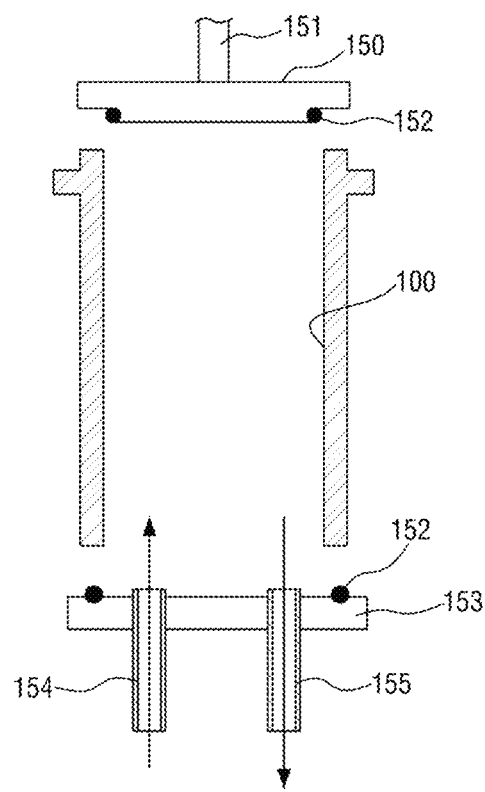
FIGS. 7A to 7D are views for illustrating a wet circulation device according to an exemplary embodiment of the present invention.

For example, when considering the tendency of miniaturization and lightweight in the cylinder block and small engines, it may be difficult or unpreferable to insert the chemical solution supply tube 140 connected to the nozzle 141 for spraying the chemical solution into the inside of the curved inner surface because of a small diameter of the cylinder bore. In this case, the wet circulation device invented by the present inventor may be used. As shown in FIG. 7A, the wet circulation device comprises an upper cover 150, and a lower support 153 for supporting the curved inner surface therebetween; a sealing means 152 to prevent the chemical solution from contacting portions except for the curved inner surface 100; an electrode rod 156 inserted into the inside of the curved inner surface 100 via the upper cover 150 to perform an electrolysis etching process on the curved inner surface 100 by using the electrode rod as a negative electrode and the curved inner surface as a positive electrode; a chemical solution supply port 154 provided at the lower support 153 for successively supplying an electrolyte; and a chemical solution discharge port 155 provided at the lower support 153 for successively discharging the electrolyte.

An extension unit 151 is attached to the upper cover 150 so that the upper cover 150 is elevated by a mechanical unit (not shown). The upper cover 150 to which the sealing 152 is attached may descend above the curved inner surface 100 to bring the sealing 152 into close contact to the curved inner surface 100. Then, the lower support 153 to which the sealing 152 is attached is closely attached to a lower portion of the curved inner surface 100 to seal the inside of the curved inner surface from the outside. Thereafter, the chemical solution required for each process is injected through the chemical solution supply port 154 disposed in the lower support 153 to supply the chemical solution onto the curved inner surface 100 and is recovered the excessive chemical solution through the chemical solution discharge port 155 after the process is completed.

Figure 7B:
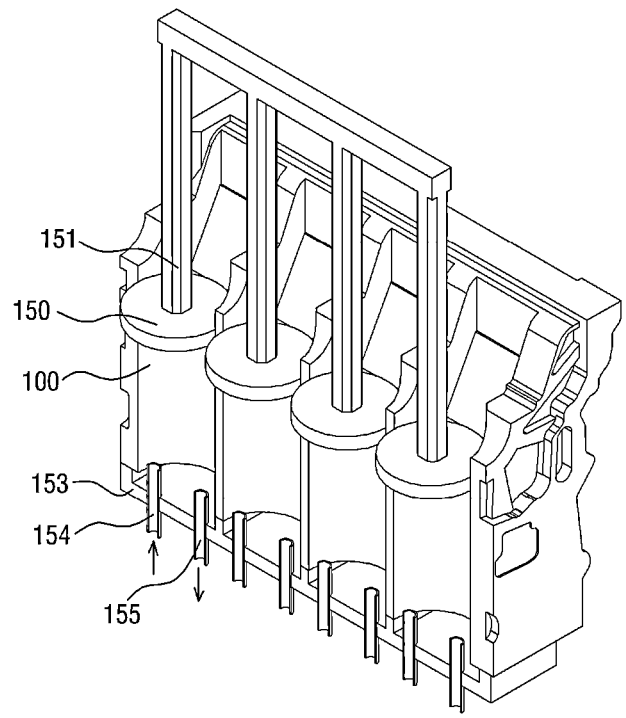

FIG. 7B is a perspective view illustrating the wet circulation device in which the chemical solution required for the wet process is supplied into and discharged from cylinder bores of a 4-cylinder type cylinder block according to an exemplary embodiment of the present invention. The chemical solution supply port 154 and the chemical solution discharge port 155 may vary in number and position.

Next, each wet process will be described below. After the exposure process is completed, the developing process is performed on the curved inner surface. The exposed portion of the negative photoresist is cured in the exposure process, and the non-exposed portion of the negative photoresist is not cured according to a kind of photosensitive photoresist. Since the positive photoresist is previously cured by heat in the exposure process, the portion onto which light is not irradiated may be maintained to the cured state, and the portion onto which light is irradiated may be changed into the uncured state.

In the developing process, only the uncured portion of the photoresist layer may be melted to expose a portion of a metal surface on which the photoresist is dissolved on the curved inner surface. In the developing process, at least one of sodium carbonate or potassium carbonate, sodium hydroxide, and potassium hydroxide is selected and then dissolved into about 0.1% to about 1% of an aqueous solution. Then, the resultant solution contacts the photosensitive photoresist layer on which the exposure process is completed. The solution may be sprayed onto the curved inner surface by using the wet spray device as shown in FIG. 6A or may contact the curved inner surface by using the wet circulation device. When the solution is sprayed, an amount of dissolved uncured photoresist may vary according to a spraying pressure, a spraying time, and a temperature and concentration of the chemical solution. Also, when the solution is circulated to contact the curved inner surface, an amount of dissolved uncured photoresist may vary according to a circulation rate, a contact time, and the temperature and concentration of the chemical solution. Thus, the above-described parameters may be managed to achieve the objection of the present invention that is to reproducibly form lubricant recesses having the minute configuration on the curved inner surface of the cylindrical object with configuration as designed.

After a predetermined time elapses, the supplying of the chemical solution may be stopped to completely discharge the chemical solution. Then, the chemical solution remaining on the curved inner surface may be cleaned and removed by spraying or supplying water. The photoresist layer remaining after contacting the developing solution may be different in degree of swelling according to a kind of photoresist layer and different in adhesion with respect to the metal surface. Thus, as necessary, the photoresist layer may be cured by using hot air or high-temperature heat.

The etching process is performed on the curved inner surface exposed by the developing process. In the etching process, an etching solution is applied to the metal surface exposed through the developing process to dissolve recess portions of the curved inner surface, thereby forming a lubricant recess pattern. Here, chemical etching solution such as acetic acid, sulfuric acid, nitric acid, hydrochloric acid, hydrofluoric acid, hydrofluoroboric acid, oxalic acid, ascorbic acid, citric acid, cyan acid, and the like may be used according to a kind of metal and a kind of photosensitive photoresist material. The etching solution may be diluted by using water or alcohol. The etching solution may be sprayed by using the wet spray device as shown in FIG. 6A or may contact the curved inner surface by using the wet circulation device as shown in FIGS. 7A and 7B. When the etching solution is sprayed as shown in FIG. 6A, lubricant recesses to be formed may vary in depth due to a dissolution rate varying according to a spraying pressure, a spraying time, and a temperature and concentration of the chemical solution. Also, when the etching solution is circulated to contact the curved inner surface as shown in FIG. 7A, lubricant recesses to be formed may vary due to a dissolution rate varying according to a circulation rate, a contact time, and the temperature and concentration of the chemical solution. Thus, the above-described parameters may be managed to achieve the objection of the present invention that is to reproducibly form lubricant recesses having the minute configuration on the curved inner surface of the cylindrical object with configuration as designed.

Figure 7C:
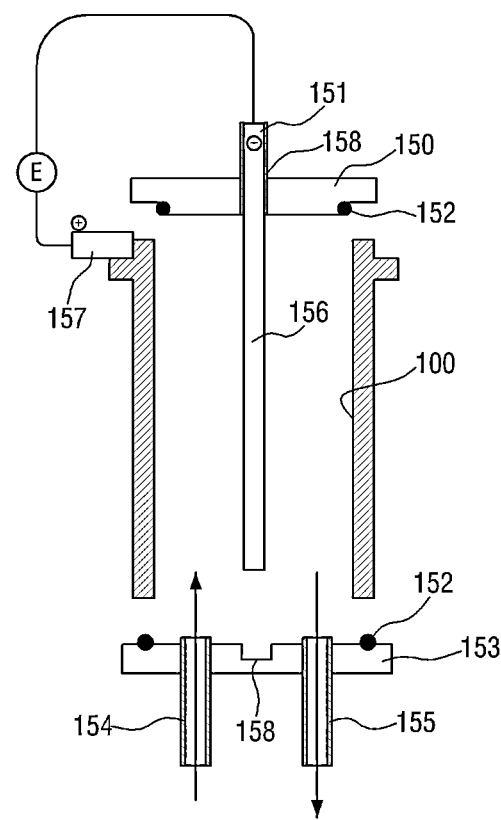

When the metal is corroded, metal oxides may be generated on the metal surface. Thus, it takes a long time to form lubricant recesses having a required depth by only contacting or spraying the chemical solution according to a corrosion process mechanism in which the metal oxides are dissolved into the etching solution, and then, a newly exposed metal is corroded by the etching solution. Thus, to solve the above-described limitation, as shown in FIG. 7C, the curved inner surface may be sealed by using the upper cover 150 and the lower support 153, and an electrode rod 156 is inserted into the inside of the curved inner surface through the upper cover 150. The other electrode 157 may be additionally provided to the upper cover 150, and electrode rod holders 158 are provided to each of the upper cover 150 and the lower support 153. The electrode rod 156 is disposed and fixed to a center of the curved inner surface 100 to apply current to the object. When current flows by using the electrode rod 156 as a negative electrode and using the other electrode 157 as a positive electrode after a chemical solution required for metal electrolysis is injected through the chemical solution supply port 154, the metal surface on the curved inner surface 100 may be ionized and dissolved into the chemical solution to cause electrolysis etching reaction.

Since the metal that is not protected by the photoresist layer is dissolved, lubricant recesses may be formed in the dissolved portion of the metal. At least one of various aqueous solutions of salts such as sodium chloride, and potassium chloride, or aqueous solution of metal salt of acetic acid, sulfuric acid, nitric acid, hydrochloric acid, hydrofluoric acid, hydrofluoroboric acid, oxalic acid, ascorbic acid, citric acid, and cyan acid may be used as an electrolyte used for the electrolysis etching process. Also, to improve the solvency of the metal ions, materials which are capable of forming complex compounds with the metal ions, such as ethylenediaminetetraacetic acid (EDTA), thiourea, thiocyanate, and the like may be added to the electrolyte. Also, a surfactant may also be added to the electrolyte to help the permeation of the solution.

As the cause electrolysis etching process is performed, the metal ions of the electrolyte may increase in concentration. Thus, the used electrolyte may be successively discharged, and a new electrolyte may be successively supplied to circulate the solution within each of the cylinder bores. Although the electrolyte is supplied and discharged through a lower portion of the cylinder block in FIGS. 7C and 7D, the present invention is not limited thereto. For example, the discharge tube may vary in position and number. To increase the electrolysis etching rate, ultrasonic vibrator may be connected to the electrode rod 156 or the object (e.g., cylinder) to apply vibration to the electrode rod 156 or the object, thereby increasing the electrolysis etching rate.

To uniformly apply current to the entire curved inner surface, the electrode rod 156 disposed at the center of the curved inner surface may have a cylindrical shape so that a distance between the surface of the electrode rod to the curved inner surface is the same on the whole. Also, the electrode rod 156 may be formed of a material such as stainless steel, titanium, silver, platinum, gold, or the like, which is insoluble with respect to the electrolyte.

Figure 7D:
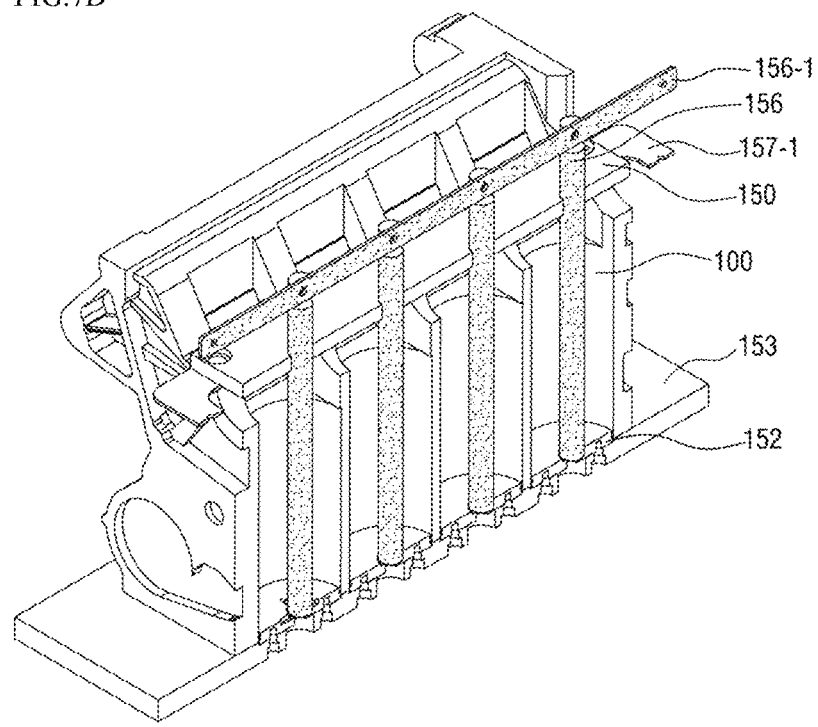

FIG. 7D is a perspective view illustrating a configuration in which the insertion of the electrode rod and the injection and discharge of the chemical solution into the cylinder bores of the 4-cylinder type cylinder block are simultaneously or successively performed, and the electrolysis etching is simultaneously performed on the plurality of cylinder bores by using the whole cylinder as a negative electrode and using the electrode rod inserted into each of the cylinder bores as a positive electrode according to an exemplary embodiment of the present invention. The electrode rod 156 inserted into each of the cylinder bores is connected to a bus bar 156-1 for the electrode rod to electrically communicate, and the other bus bar 157-1 for the electrode rod is provided to allow the whole cylinder block to electrically communicate. The upper cover 150 and the lower support 153 may be integrated with each other to cover all of the four cylinder bores. The electrode rod holder disposed on each of the upper and lower supports may be disposed at a dead center of each of the cylinder bores.

When the electrolysis etching method is applied, the electrolysis etching rate may vary according to current density, a distance between the electrode rod and the curved inner surface of the cylinder, a temperature of the electrolyte, a concentration of the electrolyte, a concentration of the metal ions of the electrolyte, and a circulation rate of the electrolyte. Also, when a method using the ultrasonic waves is combined with the electrolysis etching method, the electrolysis etching rate may vary according to the number of vibration. Thus, the above-described parameters may be managed to achieve the objection of the present invention that is to reproducibly form lubricant recesses having the minute configuration on the curved inner surface of the cylindrical object with configuration as designed.

After a predetermined time elapses, the supplying of the chemical solution may be stopped, and particularly, when the electrolysis etching method is applied, the supplying of the chemical solution and current may be stopped to completely discharge the chemical solution. Then, the chemical solution remaining on the curved inner surface may be cleaned and removed by spraying or supplying water.

The delaminating process may be performed on the object on which the etching process is completed. The delaminating process may be a process for removing the photosensitive photoresist layer remained on the curved inner surface after lubricant recesses are formed by the etching process from the curved inner surface. When at least one chemical solution selected from alkali aqueous solutions such as sodium hydroxide, potassium hydroxide, ethylene diamine, and the like contacts the photosensitive photoresist, the bonding between the polymers within the photosensitive photoresist may be broken, or the adhesion between the photosensitive photoresist and the metal of the curved inner surface may be weaken. Thus, the photosensitive photoresist layer may be separated from the metal surface of the curved inner surface. A solvent such as acetone or isoprophyl alcohol may be used in the delaminating process. The solvent may be prepared by dissolving the photosensitive photoresist. Also, it may difficult to remove the organic metal layer formed on the adhesion surface between the photoresist and the metal surface by using the solvent. Thus, the solvent may demand caution in use.

Also, the chemical solution used in the delaminating process may act on the entire metal surface to oxidize the metal surface. Thus, to prevent the metal surface from being oxidized, an azol-based compound such as benzotriazol or tolytriazole may be added. Also, a surfactant may be added to help the easy permeation of the solution between the metal of the curved inner surfaced and the photosensitive photoresist layer.

When the chemical solution is sprayed by using the wet spray device as shown in FIG. 6A, an amount of dissolved uncured photoresist may vary according to a spraying pressure, a spraying time, and a temperature and concentration of the chemical solution. Also, when the chemical solution contacts the curved inner surface by using the wet circulation device as shown in FIGS. 7A to 7B, an amount of dissolved uncured photoresist may vary according to a circulation rate, a contact time, and the temperature and concentration of the chemical solution. Thus, the above-described parameters may be managed to achieve the objection of the present invention that is to reproducibly form lubricant recesses having the minute configuration on the curved inner surface of the cylindrical object with configuration as designed.

After a predetermined time elapses, the chemical solution may be completely discharged, and then water may be sprayed or circulated to clean and remove the remaining chemical solution. Thereafter, the water remaining on the curved inner surface may be completely removed. Here, the curved inner surface may be dried by using a wiper, an air blower, or hot air. Then, a rust preventative chemical solution may be sprayed again by using the wet spray device as shown in FIG. 6A or be circulated by using the wet circulation device to contact the curved inner surface as shown in FIGS. 7A and 7B to prevent the curved inner surface from being oxidized or corroded during the transfer and storage of the curved inner surface for post processes.

A method for forming lubricant recesses having minute configurations on a curved inner surface according to another embodiment will be described below. The method for forming lubricant recesses according to another embodiment includes cleaning a curved inner surface; applying a photosensitive material on the curved inner surface to form a photoresist layer; disposing a photomask having a configuration which conforms with a configuration of said lubricant recesses proximate to the photoresist layer; exposing the photoresist layer through the photomask; developing the exposed photoresist layer; etching the curved inner surface exposed by the developing process to form a lubricant recess pattern; and delaminating the photoresist layer remained on the curved inner surface.

Figure 8:
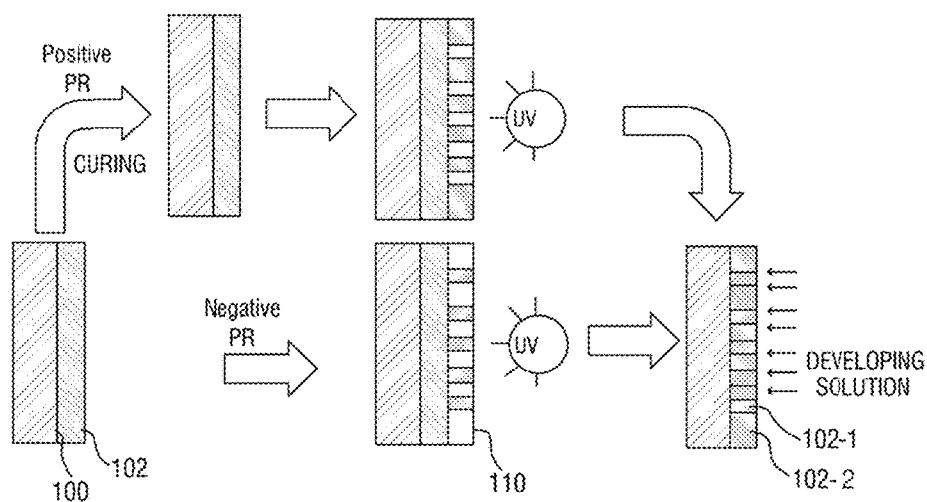
FIG. 8 is a schematic view for explaining lubricant recesses formation method according to an exemplary embodiment of the present invention.
Figure 8:
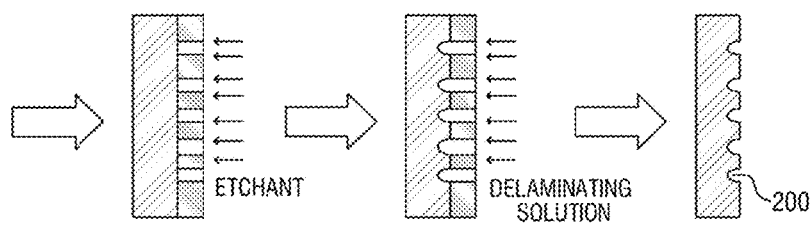

FIG. 8 is a schematic view for explaining a lubricant recess formation method according to an exemplary embodiment of the present invention. Referring to FIG. 8, a photosensitive photoresist 102 is applied on the cleaned curved inner surface 100. A film-like flexible photomask 110 having a configuration which conforms with a configuration of the lubricant recess is disposed proximity to the curved inner surface. The curved inner surface is exposed to light through the photomask. Optical radiation is directed at only the selected portions or only at the non-selected portion of the photoresist layer, depending on whether the photoresist is a negative or a positive photoresist, respectively. The photosensitive layer has cured areas 102-2 and non-cured areas 102-1. After exposure has finished, development is carried out with a developing solution. For a positive-type resist, the exposed portions are removed. For a negative-type resist, the non-exposed portions are removed. In case of negative-type photoresist, when the non-cured photosensitive photoresist layer 102-1 contacts the developing solution, the non-cured photosensitive photoresist layer may be dissolved to expose a metal on the curved inner surface. Next, the metal layer of a portion on which the negative photoresist layer patterned not coated is treated with an etching solution, and etched to form lubricant recesses 200. The photoresist attached on the curved inner surface may be removed by using the delaminating process, and then, cleaning, drying, and rust-preventing processes may be performed to form lubricant recesses having the minute configurations, that is to be formed according to the prevent invention, on the curved inner surface. Details in each process may be as described above.

Figure 9A:
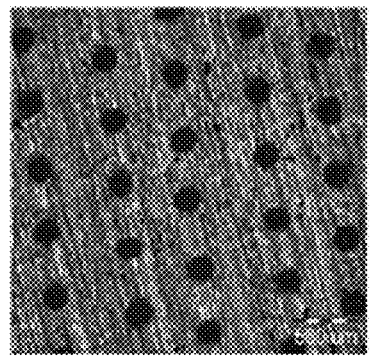
FIG. 9A is a microscope photograph of a curved surface in which the lubricant recess is formed according to an exemplary embodiment of the present invention.
Figure 9B:
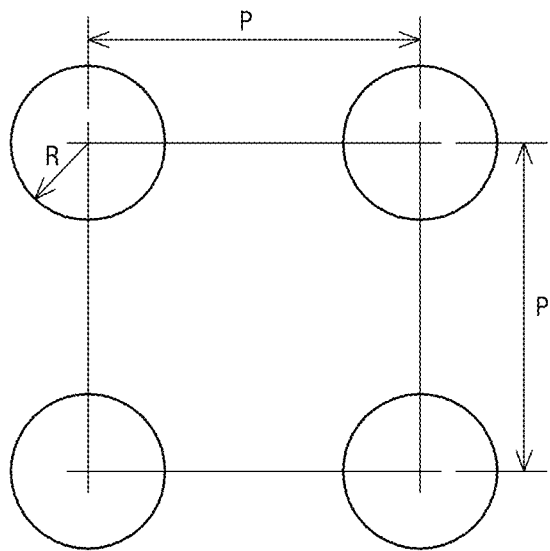
FIG. 9B is a block diagram of a torque sensor used in the foregoing embodiment.

FIG. 9A illustrates one example in which lubricant recesses is formed in an inner surface of an actual cast-iron cylinder liner by using the proposed method and apparatus of the present invention. The circular lubricant recess may have a diameter of about 100 micrometer.

Figure 9C:
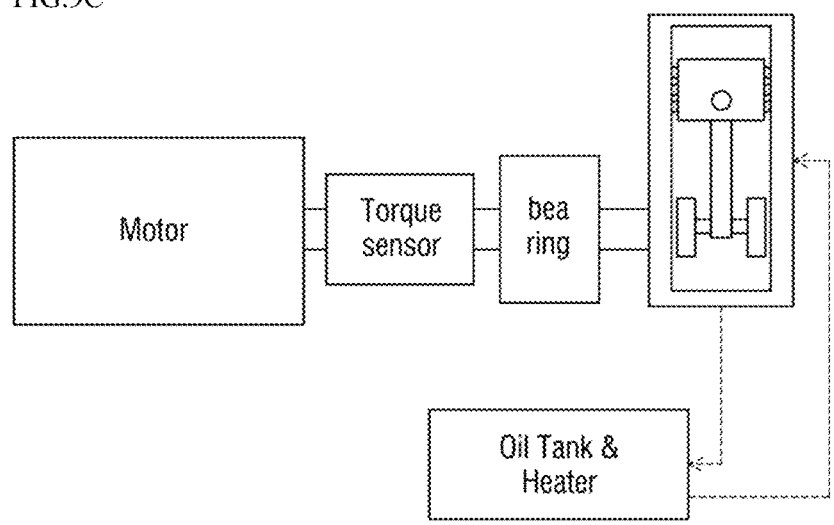
FIG. 9C is a block diagram of torque sensor used in the example.

An effect when lubricant recesses are formed on the curved inner surface of a cylinder liner or cylinder bore according to the present embodiment will be described through experiments. For example, the circular lubricant recess is formed in a cylinder liner for a JT engine manufactured by KIA Motors Corporation. Here, referring to FIG. 9A, the lubricant recess has a radius R of about 50 µm, and a distance P (pitch) between centers of the lubricant recesses is about 200 µm, about 300 µm, and about 400 µm. Then, the lubricant recess is manufactured while the lubricant recess varies in depth to about 10 µm, about 20 µm, and about 30 µm under each condition. Also, as shown in FIG. 9C, a single acting engine is manufactured on a side, and an electric motor is connected to an end of a crankshaft of the engine. Then, a bearing and a torque sensor are disposed between the motor and the engine to measure friction torque generated by the friction between a cylinder liner and a piston ring of the single acting engine through the torque sensor when the electrical motor is rotated. The measured friction torque was tabularized in FIG. 10A.

Figures 10A, 10B:
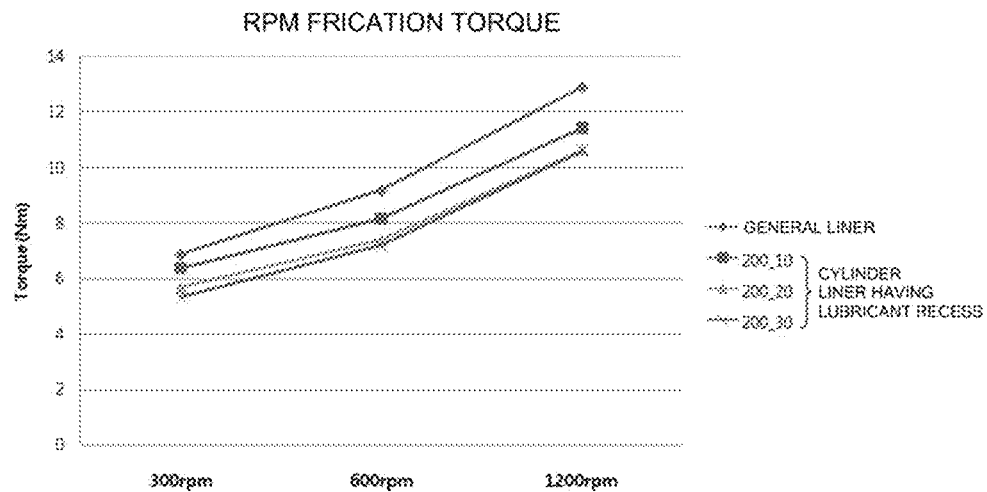
FIG. 10A is a table illustrating a result obtained by measuring a friction torque of a device in which the lubricant recess is formed by using the apparatus according to an exemplary embodiment of the present invention.
FIG. 10B is a graph illustrating a friction torque for each RPM.

As shown in FIG. 10A, it can be seen that the friction torque of the cylinder liner with lubricant recesses prepared by the present invention decreases when compared to that of a general cylinder liner in which the lubricant recess is not formed. Particularly, when the pitch between the lubricant recesses is small, and the depth of the lubricant recess is large, the reduction effect of the friction torque may be more improved. This friction reduction effect is plotted in FIG. 10B. The friction reduction effect may be understood as an effect in which a lubricant is contained into the lubricant recess having a minute size and depth to increase a thickness of an oil film between the piston ring and cylinder bore or between the piston ring and cylinder liner, thereby improving lubrication properties.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, although the general cylinder liner and 4-cylinder type cylinder block are exemplified in the foregoing embodiments, the present invention is not limited thereto. For example, the present invention may be variously applied to a single cylinder, 2-cylinders, 6-cylinders, 8-cylinders, and the like.

According to the apparatus and method for forming the lubricant recess of the present invention, lubricant recesses having the minute configuration may be uniformly and reproducibly formed as designed on the various curved inner surfaces such as the cylinder liner or the cylinder bore surface of the cylinder block. Also, the lubrication property in the product having the frictional curved surface with the cured inner surface in which lubricant recesses having the minute configurations are formed, i.e., the cylinder liner, the cylinder bore of the cylinder block, the big end of the connecting rod or big end bearing, and a rocker arm shaft insertion hole may be improved by using the method and apparatus of the prevent invention to reduce the friction and abrasion, thereby improving efficiency and durability in the internal combustion engine or compressor.

In addition, the lubricant recess having a desired configuration may be formed at the same time on the curved inner surfaces in the product having the plurality of curved surfaces such as the cylinder block having the plurality of cylinder liners through only one successive process to reduce time and costs and improve a competitive price of the product.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. An apparatus for forming lubricant recesses having minute configurations on a curved inner surface, the apparatus comprising:
   a cleaning unit for cleaning the curved inner surface;
   a photoresist layer formation unit for applying a photosensitive material on the cleaned curved inner surface to form a photoresist layer;
   a photomask placing unit for disposing a photomask having a configuration which conforms with the configuration of lubricant recesses proximate to the photoresist layer;
   an exposure unit for exposing the photoresist layer through the photomask;
   a developing unit for developing the exposed photoresist layer;
   an etching unit for selectively etching the curved inner surface exposed by the developing unit to form a lubricant recess pattern onto the curved inner surface; and
   a delaminating unit for separating or removing the photoresist layer remained on the curved inner surface; and
   wherein the photoresist layer formation unit comprises:
   a deformable coating cup for applying a photosensitive material along the curved inner surface, wherein the coating cup comprises a flexible dish-shaped portion and a protruding central portion projecting upward from the dish-shaped portion, wherein the dish-shaped portion comprises an edge configured to contact the curved inner surface;
   a quantitative injection unit for quantitatively supplying the liquid photosensitive material onto the protruding central portion of the coating cup to flow into and at least partially fill the dish-shaped portion thereof with the liquid photosensitive material;
   a driving unit for moving the coating cup with respect to the curved inner surface; and
   an extension unit for connecting the coating cup to the driving unit, and
   wherein a plurality of coating cups, quantitative injection units, driving units, and extension units are connected in parallel to transfer the liquid photosensitive material from the edges of the flexible dish-shaped portions of the coating cups to the curved inner surfaces and substantially uniformly apply the photosensitive material on a plurality of curved inner surfaces.

2. The apparatus of claim 1, wherein the photomask placing unit further comprises a vacuum-applying unit for applying vacuum between the photomask and the photoresist layer.

3. The apparatus of claim 1, wherein the exposure unit comprises:
   a light emitting unit which is inserted into the inside of the curved inner surface and irradiates light toward the curved inner surface;
   a light source lamp which is disposed inside or outside the light emitting unit and generates light that is irradiated onto the curved inner surface;
   an elevation unit for elevating and lowering the light emitting unit to take the light emitting unit in or out of the curved inner surface; and
   an extension unit for connecting the light source lamp to the elevation unit.

4. The apparatus of claim 3, wherein the exposure unit further comprises:
   a shutter for shielding light emitted from the light source lamp;
   a cooler for cooling heat generated in the light source lamp; and
   a reflecting plate for preventing the light emitted from the light source lamp from leaking.

5. The apparatus of claim 3, wherein the exposure unit is a vacuum exposure unit that performs an exposure process in a state where a predetermined vacuum pressure is applied to the curved inner surface and releases the vacuum state after the exposure process is completed.

6. The apparatus of claim 5, wherein the vacuum exposure unit comprises:
   an upper cover;
   a lower support;
   a vacuum hole defined in one side or both sides of the upper and lower supports; and
   a vacuum pump or vacuum ejector for exhausting air through the vacuum hole,
wherein the light emitting unit is integrated with one of the upper and lower supports.

7. The apparatus of claim 3, wherein the light emitting unit, the extension unit, and the elevation unit are provided in plurality that is disposed in parallel to each other to perform the exposure process for the plurality of curved inner surfaces at the same time.

8. The apparatus of claim 1, wherein the developing unit, the etching unit, and the delaminating unit comprises a wet spray device or a wet circulation device.

9. The apparatus of claim 8, wherein the wet spray device comprises:
   an upper cover and a lower support for supporting the curved inner surface therebetween;
   a sealing ring to prevent a chemical solution from contacting portions except for the curved inner surface;
   a fixed chemical solution supply tube installed at the upper cover;
   a rotatable chemical solution supply tube to which a plurality of spray nozzles is attached to spray chemical solution to the curved inner surface;
   a tube connection part for connecting the fixed chemical solution tube to the rotatable chemical solution supply tube; and
   a chemical solution discharge port for discharging the chemical solution after processing.

10. The apparatus of claim 9, wherein the fixed chemical solution supply tube is branched in a plurality of parts, the rotatable chemical solution supply tube connected to the tube connection part and a gear is provided in plurality by the number of branched parts of the fixed chemical solution supply tube, and the rotatable chemical solution supply tube is rotated by using motors or only one motor to transmit rotation force by combining the plurality of gears with each other, thereby spraying the chemical solution on the plurality of curved inner surfaces at the same time.

11. The apparatus of claim 10, wherein, when a vertical distance between nozzles attached to the rotatable chemical solution supply tube is p, a distance between an end of each of the nozzles and the curved inner surface is d, and a spraying angle of the nozzle at an applied spraying pressure is $\theta$, a distance p between the nozzles is greater than $d*\tan(\theta/2)$ and less than $2d*\tan(\theta/2)$.

12. The apparatus of claim 9, wherein, in the wet spray device, each of an upper cover and a lower support is provided in plurality to treat the plurality of curved inner surfaces at the same time, and each of the chemical solution supply port and the chemical solution discharge port has the same number as that of the plurality of curved inner surfaces.

13. The apparatus of claim 8, wherein the wet circulation device comprises:
   an upper cover, a lower support for supporting the curved inner surface therebetween;
   a sealing ring to prevent the chemical solution from contacting portions except for the curved inner surface;
   an electrode rod inserted into the inside of the curved inner surface via the upper cover to perform an electrolysis etching process on the curved inner surface by using the electrode rod as a negative electrode and the curved inner surface as a positive electrode;
   a chemical solution supply port provided at the lower support for successively supplying an electrolyte; and
   a chemical solution discharge port provided at the lower support for successively discharging the electrolyte.

14. The apparatus of claim 13, wherein each of an upper cover and a lower support is provided in plurality or extends in size to treat the plurality of curved inner surfaces at the same time, and each of the electrode rod, the chemical solution supply port, and the chemical solution discharge port has the same number as that of the plurality of curved inner surfaces.

15. The apparatus of claim 1, wherein the protruding central portion is dome shaped.

* * * * *